(12) United States Patent
Puglia

(10) Patent No.: US 7,626,464 B2
(45) Date of Patent: Dec. 1, 2009

(54) MULTI-FREQUENCY SIGNAL SOURCE

(76) Inventor: Kenneth Vincent Puglia, 146 Westview Dr., Westford, MA (US) 01886

(*) Notice: Subject to any disclaimer, the term of this patent is extended or adjusted under 35 U.S.C. 154(b) by 829 days.

(21) Appl. No.: 10/895,673

(22) Filed: Jul. 21, 2004

(65) Prior Publication Data

US 2006/0019625 A1    Jan. 26, 2006

(51) Int. Cl.
*H03L 7/00* (2006.01)
(52) U.S. Cl. .............. 331/17; 331/25; 331/34; 331/177 R; 331/179
(58) Field of Classification Search ............ 331/17, 331/179, 34, 25, 177 R
See application file for complete search history.

(56) References Cited

U.S. PATENT DOCUMENTS 5,343,168 A * 8/1994 Guthrie .................. 331/16
5,770,977 A * 6/1998 Uurtamo ................. 331/40

* cited by examiner

*Primary Examiner*—Arnold Kinkead

(57) ABSTRACT

A multi-frequency signal source and a method for providing a multi-frequency signal source with phase-lock capability are provided. The multi-frequency signal source includes a plurality of single-section filters each configured to provide oscillation of a signal at a different frequency. The multi-frequency signal source further includes a phase lock component providing a reference signal to control the oscillation at each of the frequencies.

19 Claims, 3 Drawing Sheets

US 7,626,464 B2

MULTI-FREQUENCY SIGNAL SOURCE

BACKGROUND OF THE INVENTION

This invention relates generally to systems for generating signals, and more particularly, to systems providing a multi-frequency signal source and frequency synthesis.

High spectral quality signal sources with fast frequency agility, to provide multiple frequency signal sources, may be required in, for example, a variety of radar, communications, electronic warfare and instrumentation applications. Known multi-frequency signal sources, or frequency synthesizers, typically include local oscillators that must provide stable, spectrally clean signals with rapid frequency agility. In operation, these multi-frequency signal sources may be variably tuned to a particular frequency (e.g., frequency shifting) to provide a signal source at that tuned frequency.

These known signal sources generally require wideband or broadband voltage controlled oscillators (VCOs), complex architectures or signal multiplication. For example, known multi-frequency signal sources use complex phase-lock loop architectures or frequency multiplication to provide multiple output signal frequencies.

More particularly, known multi-frequency signal sources providing multi-frequency signal generation typically use a VCO with frequency multiplication. Broadband frequency multiplication requires a high quality VCO capable of frequency set-on accuracy in order to avoid false locking. Frequency step size also is limited to integral multiples of the reference source. Further, direct frequency multiplication is often implemented in association with a step-recovery diode that requires amplification of an input power reference to a level sufficient to efficiently generate desired harmonics. Further, multi-section band pass filters are needed to reject adjacent reference line frequency components.

These multi-frequency signal sources, because of the components used, typically require a higher DC power consumption and/or more complex signal filtering to generate their signals. Also, the broadband VCOs used in these signal sources are less stable, thereby resulting in signals that are not of a high spectral quality. Additionally, these signal sources also often require heat sinks because of the heat generated from the higher power components.

BRIEF DESCRIPTION OF THE INVENTION

According to an exemplary embodiment, a multi-frequency signal source is provided that includes a plurality of single-section filters each configured to provide oscillation of a signal at a different frequency. The multi-frequency signal source further includes a phase lock component providing a reference signal to control the oscillation at each of the frequencies.

According to another exemplary embodiment, a system for providing a multi-frequency signal source includes a first feedback loop for determining a phase difference between an output signal and a reference signal. The system further includes a second feedback loop for controlling oscillation of the output signal at a plurality of frequencies. The second feedback loop receives signals from a plurality of filters with each filter corresponding to a different one of the plurality of frequencies.

According to yet another exemplary embodiment, a method for providing a multi-frequency signal source includes configuring a plurality of filters to provide a voltage controlled oscillator at a plurality of frequencies. The method further includes providing a phase lock signal based on a reference signal to control the oscillation at each of the plurality of frequencies.

DETAILED DESCRIPTION OF THE INVENTION

Various embodiments of the present invention generally provide a system and architecture for a broadband, multi-frequency signal source. The multi-frequency signal source uses a wideband amplifier in combination with switched, single-section filters, a phase-shift element and a sampling phase detector to implement phase-lock to an externally supplied reference source. The multi-frequency signal source provides broad range frequency synthesis or generation and rapid frequency agility.

Figure 1:
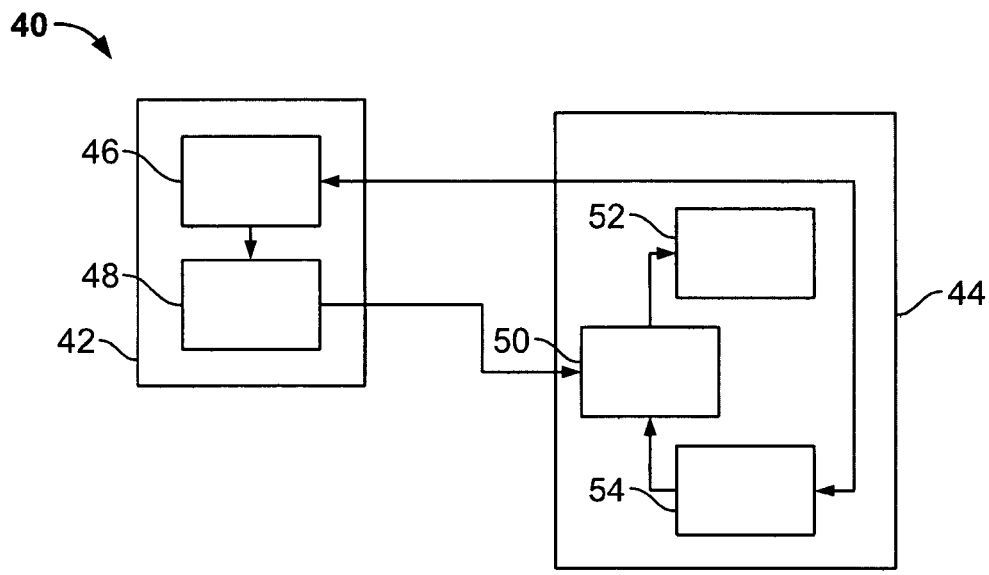
FIG. 1 is a simplified block diagram of a multi-frequency signal source constructed in accordance with an exemplary embodiment of the invention.

A multi-frequency signal source 40 constructed in accordance with an exemplary embodiment of the invention is shown in FIG. 1 and generally includes a phase lock component 42 and a voltage controlled oscillator (VCO) 44. The phase lock component 42 includes a sampling phase detector 46 for receiving a reference signal and which is also connected to a loop filter 48. The VCO 44 includes a phase shift component 50 for receiving the output of the filter 48 of the phase lock component 42 and also for optionally receiving a frequency control input signal. The phase shift component 50 is connected to an amplifier 52, the output of which is provided to the sampling phase detector 46 of the phase lock component 42 and to a filter bank 54 of the VCO 44. It should be noted that the phase-shift component 50 provides voltage control of the signal frequency, thereby implementing a voltage controlled oscillator.

Figure 2:
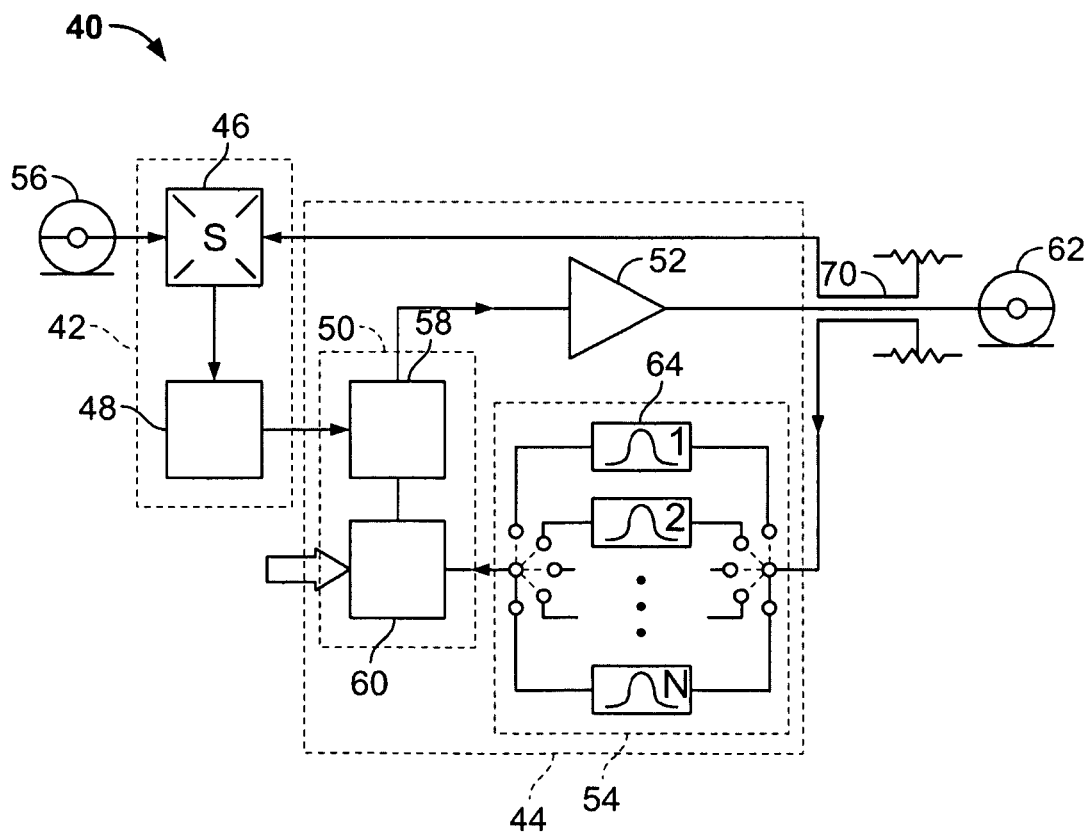
FIG. 2 is a block diagram of a multi-frequency signal source constructed in accordance with an exemplary embodiment of the invention.

More specifically, and as shown in FIG. 2, a multi-frequency signal source 40 constructed in accordance with an exemplary embodiment of the invention includes the phase lock component 42 and the VCO 44. The phase lock component 42 includes the sampling phase detector 46 configured to receive a reference input signal from a reference input source 56. For example, in one embodiment, the reference input source is a crystal oscillator (not shown), configured to generate a reference input signal at a predetermined frequency (e.g., 100 megahertz (MHz)). The output of the sampling phase detector 46 is connected to the filter 48, which in one embodiment is a low-pass filter. The output of the filter 48 is connected to an analog phase shift controller 58 that is part of the phase shift component 50. The phase shift component 50 may also include a digital phase shift controller 60 receiving a frequency control input signal. However, and as described in more detail below, in various embodiments, the phase shift component 50 only includes the analog phase controller 58 for providing frequency control of the VCO 44.

The amplifier 52, in one embodiment, is a wideband amplifier (e.g. HMMC-5200), that may be configured based on the application for the multi-frequency signal source 40, for example, based on the communication requirements. For example, for use in military communications, the amplifier may be configured to provide a ten decibel (dB) gain over a two gigahertz (GHz) to eighteen GHz frequency range. The output of the amplifier 52 is connected to the sampling phase detector 46, an output 62 that provides the multi-frequency signal, and the filter bank 54. The output 62 is connected to the amplifier 52 by a coupler 70.

The filter bank 54 includes a plurality of filters 64, and more particularly, a plurality of selectable single-section filters (e.g., single resonator filters) configured to provide coarse signal frequency determination. For example, if ten filters 64 are provided, the filter bank 54 may provide filtering (e.g., coarse signal frequency), from one GHz to ten GHz with each filter 64 filtering at one GHz intervals (e.g., one GHz, two GHz, three GHz, etc.). It should be noted that the frequency interval or shift between each of the filters 64 may be about the same or may be variable (e.g., one GHz between some filters 64 and two GHz between other filters 64). The filters 64 may be provided and configured based on, for example, the system requirements including the characteristics of the desired oscillating output and the quality factor (Q factor) for the oscillations. For example, depending on the desired or required Q factor, the filters 64 may be configured as printed filters, coaxial filters, dielectric filters or lumped element filters (e.g., inductor-capacitor filter). The filters 64 within the filter bank 54 are selectable to provide multi-frequency oscillations controlled by the VCO 44 to provide a multi-frequency signal at the output 62.

Thus, the multi-frequency signal source 40 in various embodiments uses a wideband amplifier 52 with multiple, switched, discrete feedback loops and a sampling phase detector 46 in combination with phase shift component 50 to provide a phase-locked loop implementation. Specifically, a negative feedback loop is provided from the output of the amplifier 52 to the sampling phase detector 46 and a plurality of discrete selectable positive feedback loops are provided from the outputs of the plurality of filters 64. Essentially, the negative feedback loop minimizes the phase error between the reference signal and the output signal, thereby providing a phase-lock capability. In operation, the sampling phase detector 46 determines the signal error, and more particularly, the difference in phase between the reference input and the output signal. This determined error is provided to the analog phase shift controller 58 to correct the output signal frequency and phase. The positive feedback loops in connection with the phase shift component 50 provide frequency controlled signals at a plurality of frequencies as described herein.

Figure 3:
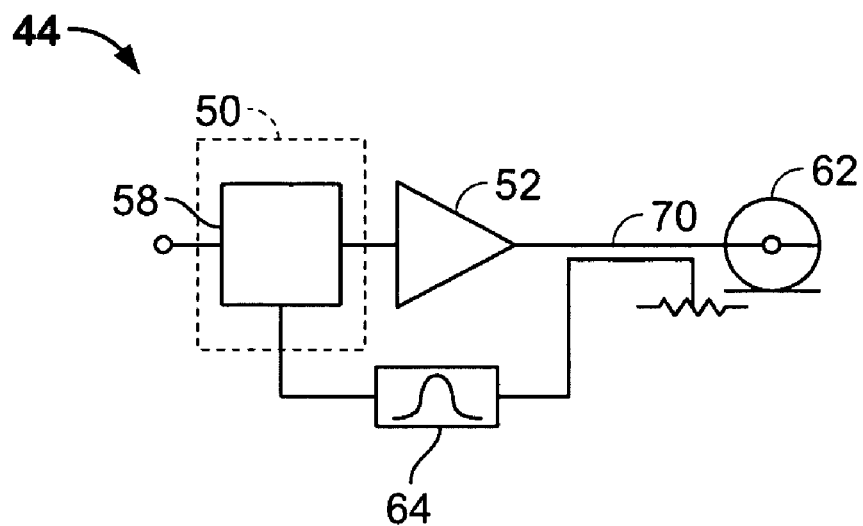
FIG. 3 is a block diagram of a feedback voltage controlled oscillator of a multi-frequency signal source constructed in accordance with an exemplary embodiment of the invention.

More particularly, and as shown in FIG. 3, the feedback VCO 44 may be implemented wherein the amplifier 52, coupler 70, one or more single-section filters 64 and the analog phase shift controller 58 are provided. The VCO 44 produces an output signal near the frequency of a filter 64 (e.g., one GHz), which may be selectable, as shown in FIG. 2, under the following conditions required for oscillation:

$$G_{p\_dB} \geq C_{dB} + \beta_{dB} \quad (1)$$

$$\Delta\phi = 0, 2\pi, \ldots 2n\pi \quad (2)$$

In Equations 1 and 2, $G_{p\_dB}$ is the gain of the amplifier 52, $C_{dB}$ is the coupling value, $\beta_{dB}$ is the loss in the feedback path through the single-section filters 64 and $\phi$ is the total loop phase shift at a specific frequency, $\omega_o$. It should be noted that if these specified conditions exist at other frequency points, the primary output spectrum may be degraded as a result of those conditions. For example, in order to prevent spurious signals and alternate oscillator modes, the single section filters 64 within the filter bank 54 are configured so as to not provide multiple responses. Thus, the response of the single-section filter 64 in the various embodiments is restricted to the specific frequency band, and which may include additional low pass filter elements (not shown) as should be appreciated. Thus, with an appropriate line length (e.g., signal line length) in each path for each of the filters 64, the digital phase shift controller 60 is not required and frequency switching may be provided by selection of the specific filter 64 within the discrete positive feedback loops.

Figure 4:
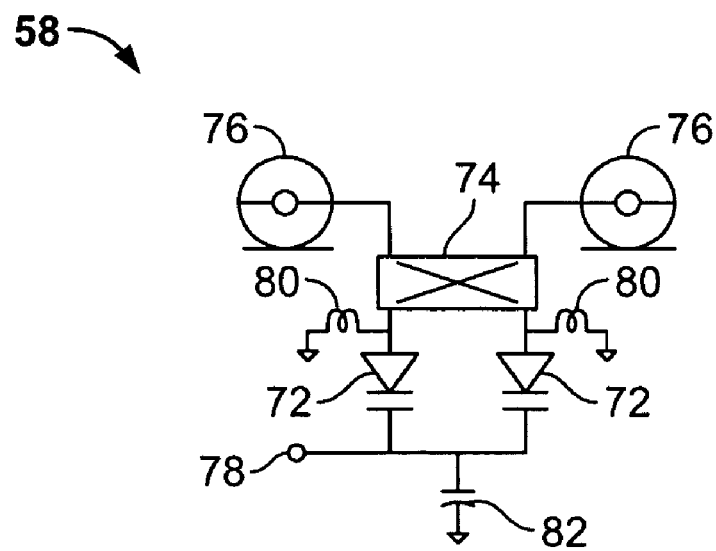
FIG. 4 is a block diagram of a typical electronic phase control component that may be implemented with a multi-frequency signal source constructed in accordance with an exemplary embodiment of the invention.

In operation, the phase shift component 50 is used to provide variable frequency operation. Specifically, phase shift within the discrete positive feedback loops produces a change in oscillator frequency (e.g., changing the phase ±30° about nominal (0°)) and producing a frequency shift of, for example, ±100 MHz. Oscillation is sustained to the extent that the total loop gain maintains a net positive value. More particularly, and as shown in FIG. 4, the analog phase shift controller 58 may include a quadrature hybrid configuration with identical varactors 72 receiving inputs from a phase shifter 74 through coupled ports 76. In operation, the output of the analog phase shift controller 58 is taken at the isolated port 78. It should be noted that inductors 80 may be implemented to provide a DC path and a capacitor 82 may be implemented to provide an RF ground.

Thus, in operation, the sampling phase detector 46 is used in combination with the analog phase shift controller 58 for phase locking to an external reference (e.g., from the reference input source 56). It should be noted that the reference frequency is not required to operate at the output frequency at the output 62, but may be provided at an integral sub-multiple of the output frequency. For example, frequency steps at 1.0 GHz may be provided with a 100 MHz reference input.

Figure 5:
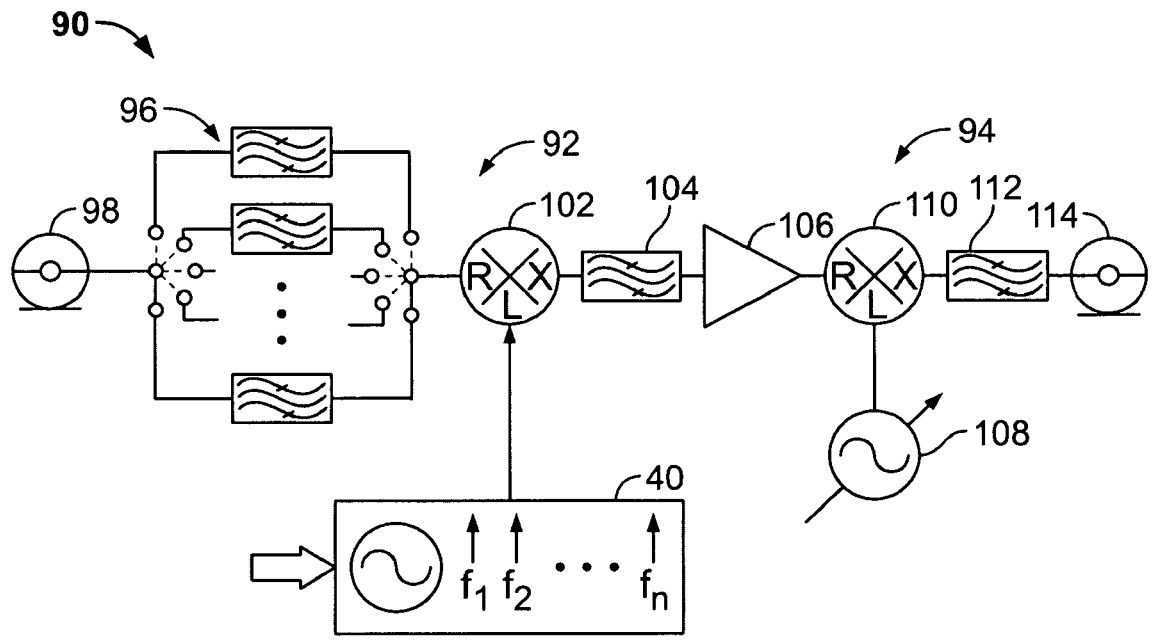
FIG. 5 is a block diagram of a multi-frequency signal source constructed in accordance with an exemplary embodiment of the invention configured as a dual conversion receiver.

Various embodiments of the invention may be configured for operation in different applications or in connection with different systems. In general, the multi-frequency signal source 40 may provide, for example, any type of local oscillator and frequency synthesizer or generation functions. For example, the various embodiments or portions thereof may be used in a broadband surveillance receiver application wherein block frequency conversion is the first element of the receiver. Specifically, and as shown in FIG. 5, a dual conversion receiver 90 having a front-end 92 for initial block conversion and a second frequency conversion stage 94 may be implemented using the multi-frequency signal source 40. This dual conversion receiver 90 may be used, for example, for signal scanning using 'Step-and-Sweep' in the first and second local oscillators, respectively. In general, the first filter bank 96 provides image rejection, and the second frequency conversion stage 94 includes an image reject mixer to reduce second stage image noise.

More particularly, a reference input source 98 is used in connection with a first filter bank 96. The output of the first filter bank 96 is mixed with the output from a multi-frequency signal source 40 (as described herein) using a mixer 102 to provide larger frequency stepping (e.g., larger intervals between each frequency signal). Thus, a multi-frequency oscillator is provided. The output of the mixer 102 is then filtered by a filter 104, for example, to remove unwanted or spurious signal noise. The signal is then amplified by an amplifier 106, and the signal then mixed with a sweep signal from a sweeper 108 by a mixer 110. The output of the mixer 110 is filtered by a filter 112 and provided at an output 114. Thus, in operation, a front-end 92 is provided for initial block conversion (e.g., larger frequency stepping) and a second frequency conversion stage 94 provides finer frequency stepping.

Figure 6:
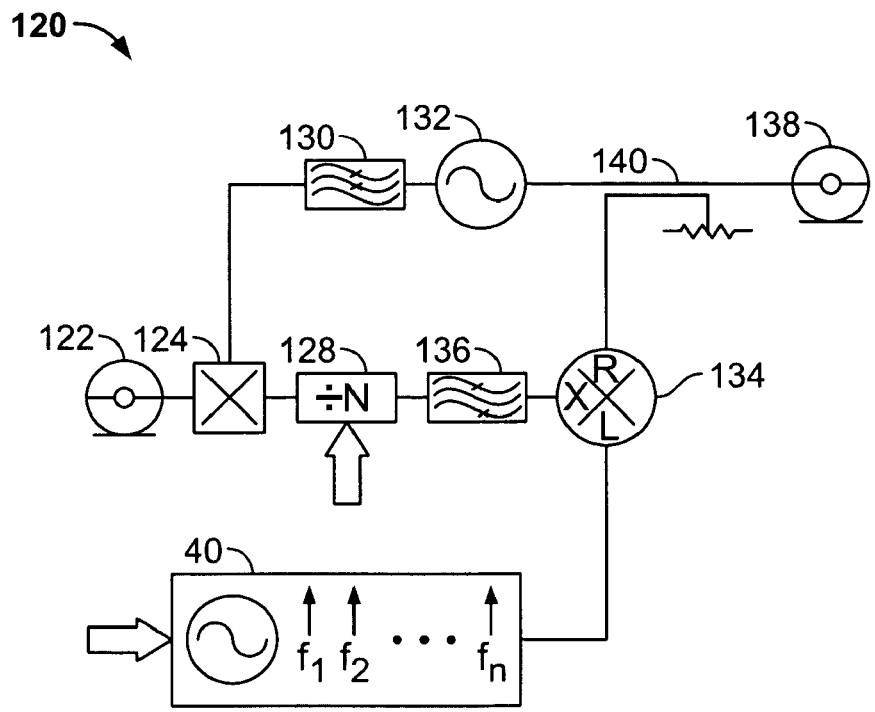
FIG. 6 is a block diagram of a multi-frequency signal source constructed in accordance with an exemplary embodiment of the invention configured as a frequency synthesizer sum loop.

As another example, broadband frequency synthesis typically requires the utilization of complementary sources in order to translate frequency or otherwise improve the synthesizer bandwidth. One application of such sources is a frequency synthesizer sum loop 120 (referred to herein as a sum loop 120) as shown in FIG. 6 wherein an additional frequency source is used to frequency translate the output signal, and which may be implemented by various embodiments of the invention or portions thereof.

The sum loop 120 reduces the feedback loop division ratio of typically implemented frequency synthesizers to improve phase noise and also extend operating frequency as determined by the equation governing the output frequency under closed loop conditions. Small and large frequency steps may also be provided. Specifically, a multi-frequency signal is provided by a multi-frequency signal source 40 (as described herein) to a mixer 134. The mixer 134 mixes the multi-frequency signal with a signal from a signal source 122 that is phase shifted by a phase shifter 124 and divided by a divider 128 to provide smaller frequency steps to the larger frequency steps provided by the signal from the multi-frequency signal source 40. The output of the divider is filtered by a filter 136 before being provided to the mixer 134. The output of the mixer 134 and the output of the VCO 132 are then coupled to an output 138 using a coupler 140. It should be noted that in one embodiment, the mixer 134 is a harmonic mixer allowing the multi-frequency signal source 40 to operate at approximately half the output frequency.

The various embodiments of the present invention are not limited to the applications described herein and the multi-frequency signal source 40 may be implemented in connection with any type or kind of system. For example, the multi-frequency signal source 40 may be implemented for use in built-in-testing (BIT) signal injection for wideband receivers.

Thus, a multi-frequency signal source is provided having an amplifier and a plurality of single-section filters, each configured for operation at a different frequency, to provide a multi-frequency output. In operation, a multi-frequency VCO is implemented at each frequency of the individual filters of a bank of filters (wherein the frequency is variable) with a frequency control component (e.g., analog phase shift controller) and a phase lock component establishing a reference frequency for phase locking the VCO. Thus, each filter in the bank of selectable filters may be stepped through and locked at an integral multiple of the reference frequency. Each filter provides a discrete frequency at which the system will oscillate when that filter is selected (e.g., automatically selected by a receiver or user selected).

While the invention has been described in terms of various specific embodiments, those skilled in the art will recognize that the invention can be practiced with modification within the spirit and scope of the claims.

What is claimed is:

1. A multi-frequency signal source comprising:
   a plurality of selectable single-section filters each configured to provide oscillation of a signal at a different frequency; and
   a phase lock component providing a reference signal to control the oscillation at each of the frequencies, wherein each of the plurality of single-section filters forms part of a discrete feedback loop for controlling the oscillation at the different frequencies.

2. A multi-frequency signal source in accordance with claim 1 further comprising a wideband amplifier connected to an output of the plurality of filters.

3. A multi-frequency signal source in accordance with claim 1 further comprising an analog phase shift controller connected to an output of the phase lock component to provide phase locking at each of the different frequencies.

4. A multi-frequency signal source in accordance with claim 1 wherein the plurality of filters are configured as a selectable bank of filters.

5. A multi-frequency signal source in accordance with claim 1 wherein a line length providing a fixed phase shift for each of the filters provides oscillation at each of the filters.

6. A multi-frequency signal source in accordance with claim 1 further comprising a phase shift component and an amplifier, which together with the plurality of filters form a voltage controlled oscillator.

7. A multi-frequency signal source in accordance with claim 1 wherein a frequency shift between each of the filters is about equal.

8. A multi-frequency signal source in accordance with claim 1 wherein a frequency shift between each of the filters is variable.

9. A multi-frequency signal source in accordance with claim 1 further comprising a digital phase shift controller for receiving a frequency control input and connected to the plurality of filters to provide additional frequency control at each of the different frequencies.

10. A multi-frequency signal source in accordance with claim 1 further comprising a phase lock component for receiving a reference signal and wherein the phase lock component providing a multiple of the reference signal to control the oscillation at each of the frequencies.

11. A multi-frequency signal source in accordance with claim 1 further comprising a sampling phase detector configured to receive a feedback signal from at least one of the plurality of filters for controlling signal oscillation.

12. A system for providing a multi-frequency signal source, said system comprising:
    a first feedback loop for determining a phase difference between an output signal and a reference signal; and
    a second feedback loop for controlling oscillation of the output signal at a plurality of frequencies, the second feedback loop receiving signals from a plurality of filters, each filter corresponding to a different one of the plurality of frequencies.

13. A system in accordance with claim 12 further comprising a sampling phase detector and in combination with the first feedback loop forming a phase-locked loop configuration.

14. A system in accordance with claim 12 further comprising an analog phase shift controller and an amplifier, which in combination with the plurality of filters forming a voltage controlled oscillator.

15. A system in accordance with claim 14 further comprising a digital phase shift controller in combination with the analog phase shift controller, which together controls the frequency of the output signal.

16. A method for providing a multi-frequency signal source, said method comprising:
- configuring a plurality of selectable filters to provide a voltage controlled oscillator at a plurality of frequencies, wherein the voltage controlled oscillator includes a phase shift component and an amplifier; and
- providing a phase lock signal based on a reference signal to control the oscillation at each of the plurality of frequencies.

17. A method in accordance with claim 16 further comprising providing phase correction at each of the plurality of frequencies using a sampling phase detector receiving feedback signals from the voltage controlled oscillator.

18. A method in accordance with claim 16 further comprising configuring an analog phase shift controller to control the oscillation frequency at each of the plurality of frequencies.

19. A method in accordance with claim 18 further comprising configuring a digital phase shift controller to control the oscillation frequency at each of the plurality of frequencies.

* * * * *